United States Patent [19]

Greene et al.

[11] Patent Number: 4,594,546
[45] Date of Patent: Jun. 10, 1986

[54] VOLTMETER FOR REMOTELY SENSING HIGH VOLTAGES

[75] Inventors: Hugh W. Greene, Somerville; James D. Holder; Thomas G. Roberts, both of Huntsville, all of Ala.

[73] Assignee: The United States of America as represented by the Secretary of the Army, Washington, D.C.

[21] Appl. No.: 588,488

[22] Filed: Mar. 12, 1984

[51] Int. Cl.⁴ ............................................ G01R 31/02
[52] U.S. Cl. .................................. 324/122; 250/227; 361/120
[58] Field of Search ................ 324/133, 122, 96, 120, 324/111, 72; 250/227, 215; 455/612; 331/127, 129; 361/120; 315/227, 232, 241 R

[56] References Cited

U.S. PATENT DOCUMENTS

| | | | |
|---|---|---|---|
| 1,229,699 | 6/1917 | Armor | 324/122 |
| 3,126,511 | 3/1964 | Redemske et al. | 331/127 |
| 3,488,586 | 1/1970 | Watrous et al. | 324/96 |
| 3,611,339 | 10/1971 | Richey et al. | 324/122 |
| 3,676,743 | 7/1972 | Bahr et al. | 361/120 |
| 4,245,155 | 1/1981 | Witting | 250/227 |

Primary Examiner—Reinhard J. Eisenzopf
Assistant Examiner—Vinh Phu Nguyen
Attorney, Agent, or Firm—Anthony T. Lane; Robert P. Gibson; Robert C. Sims

[57] ABSTRACT

A passive voltmeter that measures pulses of high voltage by periodically discharging a condensor through a spark gap. The frequency at which the spark gap breaks down is a function of the voltage being measured and is detected and displayed in volts. Radioactive material within the chamber is used to insure a constant breakdown voltage by supplying the necessary free electrons. This insures constant breakdown time for the arc with minimum jitter.

4 Claims, 2 Drawing Figures

VOLTMETER FOR REMOTELY SENSING HIGH VOLTAGES

DEDICATORY CLAUSE

The invention described herein may be manufactured, used, and licensed by or for the Government for governmental purposes without the payment to us of any royalties thereon.

BACKGROUND OF THE INVENTION

In the technology for supplying pulsed power for the development of high power lasers, flash x-ray machines, nuclear electromagnetic pulse simulators, high energy particle accelerators, and for high powered devices for producing and radiating non-nuclear video pulses, diagnostics has always been difficult. For example, it is sometimes necessary to measure voltages of the order of 10's to 100's of KV at places where the total voltage may rise to levels higher than 15 million volts during a pulse. Not only is it necessary to isolate the voltage monitoring device from ground but it is also necessary to have the voltmeter immuned to damage by suddenly changing inductive fields and RF noise. In the past it has not been possible to make these measurements; however, recently two devices have been disclosed for this purpose. One is an acoustic waveguide voltage monitor, Kenton L. Haynes et al, inventors, U.S. patent application Ser. No. 423,973 filed Sept. 27, 1982 now U.S. Pat. No. 4,514,684. All of the coinventors of the present invention were coinventors of this invention. Haynes et al is a monitoring system which consists of a voltage controlled oscillator for producing acoustic waves whose frequency is proportional to the voltage being measured. An acoustic waveguide is used for transmitting the wave to an electrically isolated acoustic to an electrical transducer. The output of the transducer is amplified and then displayed on an appropriate readout calibrated in watts. However, there are some disadvantages associated with this device in particular environments. The requirement for a power supply at the location where the measurement is to be made not only makes this device larger than desired but it also causes downtime when the prime power source has to be replaced, which is all too often. This also tends to destroy the integrity of the RF shield which leads to the destruction of the device. The integrity of the RF shield degrades with time and use due to vibrations and other motions, thus limiting the life of these devices. In practice this has severly limited the life. The response time of the acoustic device is much too slow to follow rapid changes in the voltage level which may be at GHz rates. The acoustic waveguide is either too stiff to allow easy placement around corners or it is likely to get crimped which stops the transmission of the acoustic wave and causes the device not to operate. And finally the acoustic waveguide has to be unnecessarily long to obtain adequate electrical isolation because of the possible breakdown path in air.

The other device is disclosed in U.S. patent application Ser. No. 454,789, filed Sept. 30, 1982 by Thomas G. Roberts, now abandoned, who is a coinventor of the present invention and relates to a fiber optic guided light wave voltmeter consisting of a diode laser light source, an optical fiber light guide, a polarizer, a polarization analyzer, an optical power meter and a voltage display unit which may be either digital or analog and calibrated in volts. The use of the fiber optic light guide coupled with the application of the photoelastic effects circumvents all the problems associated with the acoustic waveguide voltage monitor. However, it is now necessary to measure the intensity of the light beam which is much more difficult than measuring a frequency. This leads to a rather elaborate calibration procedure with no means other than recalibration to determine that the device has remained in calibration. Also the range of the voltage which may be monitored is limited by the magnitude of photoelastic effect. That is, this device is used in a manner such that the light intensity is 0 at the peak voltage that should be measured. But at higher voltage this effect allows light to pass and the monitor then registers a decrease in voltage instead of an increase in voltage which actually occurred.

The object of this invention is to supply a remotely sensed passive volt meter which does not require a self contained power supply which is completely immuned to RF damage, which is simple and easy to construct at low cost and which is easy to use in that it is passive and does not require calibrating once it has been constructed.

SUMMARY OF THE INVENTION

A device that measures pulses of high voltage using a condensor that discharges through a spark gap. The frequency at which the spark gap breaks down is a function of the voltage being measured and is detected and then displayed in volts.

DESCRIPTION OF THE PREFERRED EMBODIMENT

Figure 1:
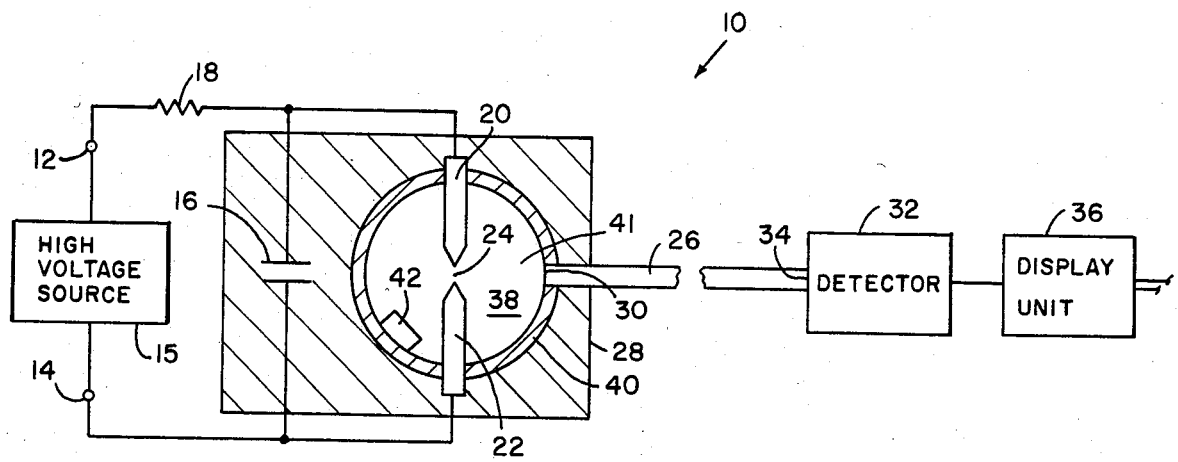
FIG. 1 is a diagram of the remotely sensed passive voltmeter with extraneous circuitry omitted.

Referring now to the drawings wherein like numbers represent like parts, FIG. 1 is a drawing of the remotely sensed passive voltmeter 10. The terminals of the voltmeter 12 and 14 are coupled across the high voltage from source 15 which is to be measured, a condensor 16 is coupled to terminal 14 and a resistor 18 is coupled between terminal 12 and the other side of the condensor 16. A pair of electrodes 20 and 22 is disposed in spaced relation to form a spark gap 24 therebetween. Electrode 20 is connected intermediate resistor 18 and condensor 16 and electrode 22 is connected on the other side of condensor 16. Fiber optic light pipe 26 is connected to a housing 28 and communicates with the spark gap 24 on one end 30 and a detector 32 on the other end 34. The detector 32 is connected to the display unit 36. Detector 32 senses the frequency at which the spark gap 24 breaks down, detecting the light flashes (arcs) that occur during gap breakdown and providing a voltage output. The display unit 36 displays this measurement in volts.

The spark gap 24 and the condensor 16 are contained in a solid housing 28 which may be made of quartz, ceramics or non-conducting epoxies. The housing is immersed in oil. The resistor 18 is mounted outside but may also be contained in the solid housing 28. The spark gap 24 is a point-to-point type but other types may be used. The points of the spark gap 24 are contained in an optical cavity 38 within housing 28. The optical cavity is coated with a reflecting coating 40 for reflecting visible light except where the electrodes of the spark gap 24 enter and the fiber optic light pipe is located. The coating reduces the loss in the system and improves efficiency. The cavity contains an inert gas 41 such as argon and a radioactive source 42 which is an alpha emitter. This source 42 is used to insure a constant breakdown voltage by supplying the necessary free electrons. This insures constant breakdown times for the arc with minimum jitter. This source may be contained in electrodes 20 and 22, in the reflecting coating 40 or may be simply mounted on the wall of cavity 38. As an example, tungsten electrodes may be used which contain radioactive thorium.

In operation, the terminals 12 and 14 are connected across the high voltage to be measured. As the potential is increased the condensor 16 is charged and receives a potential. When the potential on the condensor 16 reaches the breakdown voltage of the spark gap, a flash of light appears and the condensor 16 is discharged, the potential on the condensor 16 quickly falls to zero and the light is extinguished. The condensor 16 is then charged again and the process is repeated. Resistor 18 serves as a load across the power source when the condensor is discharging and may also be used to prevent the power source from sustaining the arc after the capacitor is discharged.

The time needed to charge the condensor 16 to the breakdown voltage of the spark gap 24 is given by the equation $t_B = RC \ln(1 - E_B/E)$ where $t_B$ is the time in seconds, R is the resistance of resistor 18 in ohms, C is the capacitance of condensor 16 in farads, $E_B$ is the breakdown voltage of spark gap 24 in volts, and E is the voltage being measured in volts. The magnitudes of the resistance the capacitance and the breakdown voltage of the spark gap 24 are determined when the device is designed and are thus constant, leaving the voltage to be measured E the only variable in the above mentioned equation. The value of C, the capacitance of condensor 16, is chosen as small as possible to insure that very little power is dissipated in the spark gap 24 but large enough to produce the desired intensity of light in the flash of light.

The power dissipated by the spark gap 24 is given by the equation $P = W_c \times f$, where P is the power, $W_c$ is the energy in condensor 16 each time the breakdown voltage is reached, and f is the frequency at which the spark gap breaks down. The value of $W_c$ is given by the equation $W_c = \frac{1}{2} CE_B$. The current drain on the system is given by the equation $I = P/E_B$ where I is the current drain. The power dissipated by the resistor is given by the equation $P_R = I^2 R$, where $P_R$ is the power dissipated in the resistor 18.

As an example, if $E_B$, the breakdown voltage for the spark gap 24, is 5000 volts, $t_B$, the time needed to charge the condensor 16, is $10^{-3}$ seconds, the voltage being measured is $10^5$ volts, C, the capacitance in the condensor 16 is $10^{-10}$ farads, and R, the resistance in the resistor 18, is $2 \times 10^8$ ohms, the energy dissipated in the spark gap is 1.25 watts, the current drain on the system is 12.5 microamps and the power being dissipated in the resistor is $3.125 \times 10^{-2}$ watts. The power dissipation in the resistor and spark gap is so small as not to cause any problems. The current drain does not load the system.

The frequency can be decreased by increasing the pressure of the inert gas in the spark gap. The breakdown voltage can be decreased, thus increasing the frequency, by putting the spark gap 24 electrodes closer.

Figure 2:
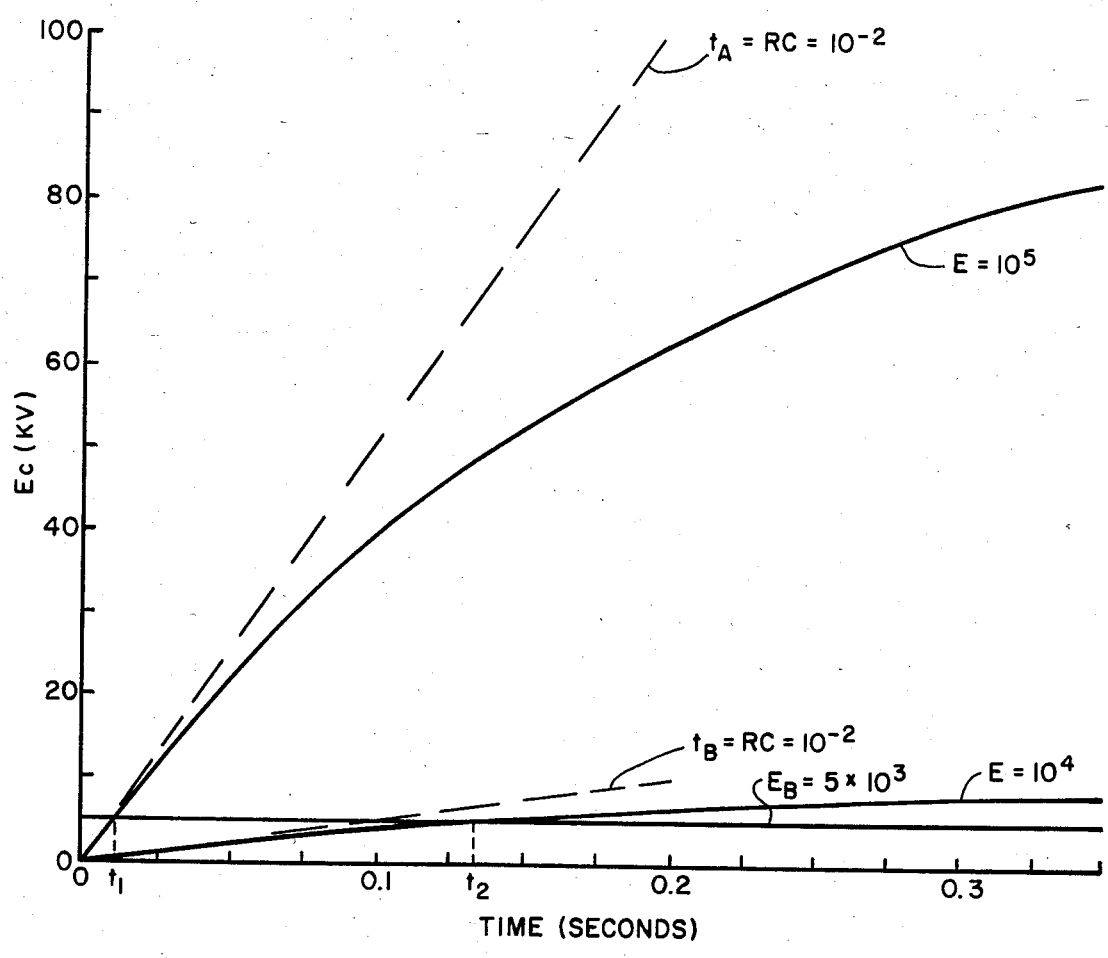
FIG. 2 is a diagram showing the variation of the discharge time with the voltage to be measured.

FIG. 2 graphically illustrates the time needed to reach breakdown voltage. Two examples are shown by the solid curves one for $E = 10^5$ and one for $E = 10^4$. The breakdown voltage $E_B$ which is constant at $5 \times 10^3$ is represented by the straight line so labelled. The time needed to reach breakdown voltage $E_B$ for $E = 10^5$ is shown where the curve $E = 10^5$ intersects $E_B$ and is labelled $t_1$. The time needed to reach breakdown voltage $E_B$ for $E = 10^4$ is shown where the curve $E = 10^4$ intersects $E_B$ and is labelled $t_2$. The RC product is the time for the capacitor C to become fully charged at a linear charging rate equal to the initial charging rate as indicated by the dashed curves. The capacitor C is fully charged when $E_c$, the voltage on the capacitor equals E, the voltage being measured. The two dashed lines $t_A$ and $t_B$ represent two different linear charging rates.

Although a particular embodiment and form of the invention has been described, it will be obvious to those skilled in the art that modifications may be made without departing from the scope and spirit of the foregoing disclosure.

We claim:

1. A passive voltmeter for sensing high voltages over ten KV comprising; a housing having a cavity therein; first and second electrical leads adapted for connection to a source of high voltage, a condenser and a resistor connected in series across said first and second electrical leads and having a junction therebetween, first and second electrodes disposed in said cavity in spaced relation to form a spark gap therebetween, said first electrode being connected to said junction intermediate said resistor and said condenser, said second electrode being connected to said second electrical lead; fiber optic light pipe having first and second ends with said first end located inside said cavity for detecting the rate of light pulses caused by the electrodes and transferring this rate to said second end, a detector connected to said second end for converting said rate to a voltage proportional to said high voltage, and a display unit connected to said detector.

2. A voltmeter as set forth in claim 1 and further comprising a reflective coating on the inner surface of said cavity.

3. A voltmeter as set forth in claim 2 and further comprising a radioactive source disposed in said cavity.

4. A voltmeter as set forth in claim 3 wherein said electrodes are radioactive.

* * * * *